United States Patent
Teramoto

(10) Patent No.: US 9,299,844 B2
(45) Date of Patent: Mar. 29, 2016

(54) ACCUMULATION-MODE MOSFET AND DRIVING METHOD THEREOF

(71) Applicant: Akinobu Teramoto, Sendai (JP)

(72) Inventor: Akinobu Teramoto, Sendai (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 14/636,817

(22) Filed: Mar. 3, 2015

(65) Prior Publication Data

US 2015/0179788 A1    Jun. 25, 2015

Related U.S. Application Data

(63) Continuation of application No. PCT/JP2012/006858, filed on Oct. 25, 2012.

(51) Int. Cl.
| | |
|---|---|
| H01L 29/66 | (2006.01) |
| H01L 29/78 | (2006.01) |
| H01L 29/76 | (2006.01) |
| H01L 29/08 | (2006.01) |
| H03K 17/687 | (2006.01) |

(52) U.S. Cl.
CPC .......... *H01L 29/785* (2013.01); *H01L 29/0895* (2013.01); *H01L 29/7606* (2013.01); *H03K 17/687* (2013.01); *H01L 2029/7857* (2013.01)

(58) Field of Classification Search
None
See application file for complete search history.

(56) References Cited

U.S. PATENT DOCUMENTS

| | | | |
|---|---|---|---|
| 5,177,568 A | 1/1993 | Honma et al. | |
| 5,581,100 A | 12/1996 | Ajit | |
| 5,844,273 A | 12/1998 | Konishi | |
| 5,920,088 A * | 7/1999 | Augusto | H01L 21/823885 257/192 |
| 6,191,447 B1 * | 2/2001 | Baliga | H01L 29/42368 257/330 |
| 8,878,292 B2 | 11/2014 | Hébert et al. | |
| 2006/0214221 A1* | 9/2006 | Challa | H01L 21/3065 257/328 |
| 2007/0145377 A1 | 6/2007 | Miura | |
| 2009/0272982 A1* | 11/2009 | Nakamura | H01L 29/66666 257/77 |
| 2009/0309138 A1 | 12/2009 | Ohmi et al. | |
| 2011/0198702 A1 | 8/2011 | Ohmi et al. | |
| 2011/0210375 A1 | 9/2011 | Ikeda et al. | |

FOREIGN PATENT DOCUMENTS

| | | |
|---|---|---|
| JP | 04-091480 | 3/1992 |
| JP | 2011-181617 | 9/2011 |
| TW | 2009-045588 | 11/2009 |
| WO | 2005/083796 | 9/2005 |
| WO | 2008/007749 | 1/2008 |
| WO | 2010/050405 | 5/2010 |

OTHER PUBLICATIONS

Cheng et al., "Impact of Improved High-Performance Si(110)-Oriented Metal-Oxide-Semiconductor Field-Effect Transistors Using Accumulation-Mode Fully Depleted Silicon-on-Insulator Devices", Jpn. J. Appl. Phys., vol. 45, No. 4B (2006) 3110-16.

(Continued)

*Primary Examiner* — Cassandra Cox

(74) *Attorney, Agent, or Firm* — Fitzpatrick, Cella, Harper & Scinto

(57) ABSTRACT

There is provided an accumulation-mode MOSFET. The accumulation-mode MOSFET has a tunnel electron emission portion and a thermionic emission portion which are provided in a source region portion.

4 Claims, 3 Drawing Sheets

(56) References Cited

OTHER PUBLICATIONS

Kanghoon et al., "Si Tunnel Transistors with a Novel Silicided Source and 46mV/dec Swing", Symposium on VLSI Technology Digest of Technical Papers, vol. 201 (2010) 121-22.

Kuroda et al., "Performance Comparison of Ultrathin Fully Depleted Silicon-on-Insulator Inversion-, Intrinsic-, and Accumulation-Mode Metal-Oxide-Semiconductor Field-Effect Transistors", Jpn. J. Appl. Phys., vol. 47, No. 4 (2008) 2668-71.

* cited by examiner

ACCUMULATION-MODE MOSFET AND DRIVING METHOD THEREOF

This application is a continuation of International Patent Application No. PCT/JP2012/006858 filed on Oct. 25, 2012, the entire content of which is incorporated herein by reference.

BACKGROUND OF THE INVENTION

1. Field of the Invention

The present invention relates to an accumulation-mode MOSFET and a driving method thereof.

2. Description of the Related Art

In recent semiconductor integrated circuit apparatuses (to be also referred to as "LSI apparatuses" hereinafter), an enormous number ($10^9$ to $10^{12}$) of functional elements such as transistors are integrated at high density along with development of a micropatterning technique. The power consumption of such apparatus is large, and thus the apparatus is becoming unsuitable for the recent energy saving trend.

To reduce the power consumption of the LSI apparatus, it is essential to decrease its power supply voltage. This is important not only in the semiconductor field but also in the semiconductor integrated product field, and is an urgent matter. To decrease the power supply voltage of the LSI apparatus, it is necessary to decrease the power supply voltage of an MOSFET (Metal-Oxide-Semiconductor Field-Effect-Transistor) as a main electronic component of the LSI apparatus as much as possible. At the same time, it is an important issue to sufficiently improve the current driving capability upon power-on. To do so, it is necessary to increase the ratio between drain currents upon power-off (0 V) and power-on (power supply voltage) of the MOSFET, thereby decreasing a threshold voltage as much as possible.

To improve the current driving capability, an accumulation-mode MOSFET (to be also referred to as an "A-mode MOSFET" hereinafter) is more advantageous than a so-called inversion-mode MOSFET (to be also referred to as an "I-mode MOSFET hereinafter) (Impact of Improved High-Performance Si(110)-Oriented Metal-Oxide-Semiconductor Field-Effect Transistors Using Accumulation-Mode Fully Depleted Silicon-on-Insulator Devices. W. Cheng et al., Jpn. J. Appl. Phys., vol. 45, p. 3110, 2006. (NPL 1) and Performance Comparison of Ultrathin Fully Depleted Silicon-on-Insulator Inversion-, Intrinsic-, and Accumulation-Mode Metal-Oxide-Semiconductor Field-Effect Transistors. R. Kuroda et al., Jpn. J. Appl. Phys., vol. 47, p. 2668, April 2008. (NPL 2)).

In the A-mode MOSFET described in NPLs 1 and 2, however, carriers move by thermionic emission and thus an S value (a gate voltage for increasing the drain current by an order of magnitude) is 60 mV/dec or larger (room temperature).

To the contrary, there is a case in which an S value of 46 mV/dec is achieved by a structure that performs tunnel electron emission (Si Tunnel Transistors with a Novel Silicided Source and 46 mV/dec Swing. J. Kanghoon et al., in 2010 Symposium on VLSI Technology, 201, p. 121. (NPL 3)). In the example described in NPL 3, although an S value of 46 mV/dec is achieved, the current driving capability upon power-on is incomparably smaller than that of a general thermionic emission type.

SUMMARY OF THE INVENTION

According to the first embodiment, an accumulation-mode MOSFET comprises a tunnel electron emission portion and a thermionic emission portion which are provided in a source region portion.

According to the second embodiment, in the accumulation-mode MOSFET according to the first embodiment, the tunnel electron emission portion and the thermionic emission portion form a two-layered structure.

According to the third embodiment, a method of driving an accumulation-mode MOSFET comprises driving the accumulation-mode MOSFET by a tunnel current when transiting from an OFF state to an ON state, and driving the accumulation-mode MOSFET by a thermionic current in the ON state, wherein a tunnel electron emission portion and a thermionic emission portion are provided in a source region portion of the accumulation-mode MOSFET.

Other features and advantages of the present invention will be apparent from the following explanation taken in conjunction with the accompanying drawings. Note that the same reference numerals denote the same or similar parts in the accompanying drawings.

The accompanying drawings, which are incorporated in and constitute a part of the specification, illustrate embodiments of the invention and, together with the description, serve to explain the principles of the invention.

DESCRIPTION OF THE EMBODIMENTS

Some embodiments provide an accumulation-mode MOSFET in which the ratio between drain currents upon power-off (0 V) and power-on (power supply voltage) of the MOSFET is large and a current driving capability upon power-on is also large. Some embodiments provide an accumulation-mode MOSFET having high switching performance and a high current driving capability.

According to some embodiments, it is possible to provide an accumulation-mode MOSFET in which the ratio between drain currents upon power-off (0 V) and power-on (power supply voltage) is large and a current driving capability upon power-on is large, and a method of driving the accumulation-mode MOSFET. Furthermore, it is possible to provide an accumulation-mode MOSFET having high switching performance and a high current driving capability.

Figure 1:
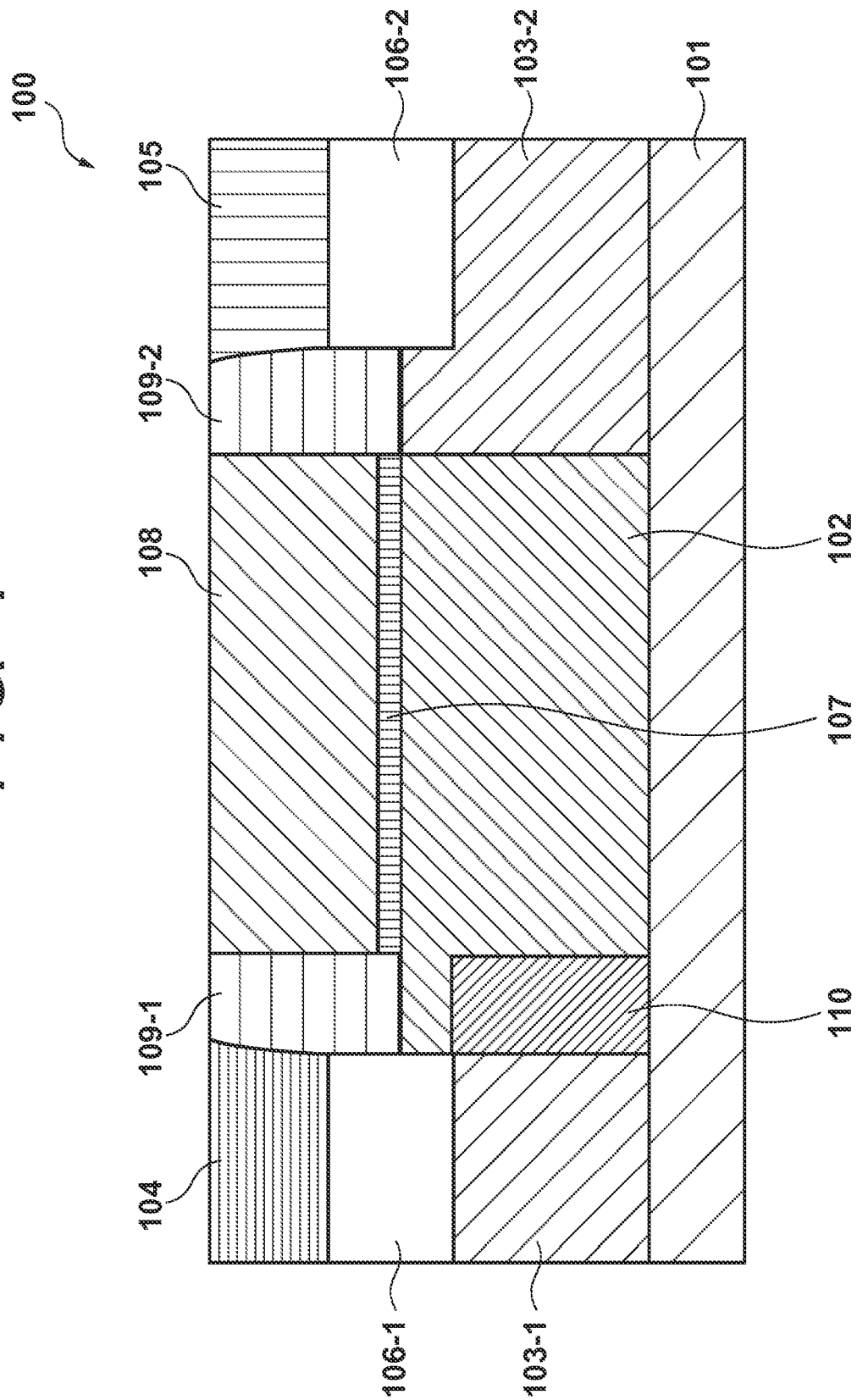
FIG. 1 is a schematic view for explaining the main parts of the structure of an accumulation-mode MOSFET according to a preferred embodiment of the present invention.

FIG. 1 is a schematic view for explaining the main parts of the structure of an accumulation-mode MOSFET according to a preferred embodiment of the present invention.

An A-mode MOSFET 100 shown in FIG. 1 includes an n$^-$ silicon (Si) semiconductor region (to be simply referred to as an "n$^-$ region" hereinafter) 102 where a channel region is formed on a BOX (Buried oxide) layer 101 made of $SiO_2$ (silicon oxide) or the like, and two n$^+$ silicon (Si) semiconductor regions (to be simply referred to as "n$^+$ regions" hereinafter) 103-1 and 103-2 for forming an ohmic contact.

The BOX layer 101 is provided by a general semiconductor manufacturing technique using a silicon (Si) semiconductor substrate. A typical example of the BOX layer is an SOI (Silicon on Insulator) substrate formed by a bonding method. Two Si semiconductor substrates each having, on its surface, an $SiO_2$ layer of a predetermined thickness formed by oxidizing the surface in advance are prepared, and are bonded so that their SiO$_2$ layers face each other. After that, the surface of the Si semiconductor region of one of the Si semiconductor substrates is polished by CMP or the like, thereby obtaining a Si semiconductor region layer of a predetermined thickness. Another example is an SOI substrate formed by ion-implanting oxygen into the Si semiconductor substrate and performing a heat treatment.

A source electrode 104 is electrically connected to the n$^+$ region (source region) 103-1 via a silicide region 106-1. A drain electrode 105 is electrically connected to the n$^+$ region (drain region) 103-2 via a silicide region 106-2.

A gate electrode 108 is provided on the n$^-$ region 102 via a gate insulating layer 107.

The gate insulating layer 107 and the gate electrode 108 are electrically insulated from the source electrode 104, drain electrode 105, and silicide regions 106-1 and 106-2 by insulating regions 109-1 and 109-2.

The silicide region 106-1 is provided under desired conditions so that an ohmic contact is formed in "source electrode 104/silicide region 106-1/n$^+$ region 103-1/n$^-$ region 102". The silicide region 106-2 is provided under desired conditions so that an ohmic contact is formed in "drain electrode 105/silicide region 106-2/n$^+$ region 103-2/n$^-$ region 102".

The n$^+$ regions 103-1 and 103-2 are not always necessary as long as preferred ohmic contacts are formed between the source electrode 104 and the n$^-$ region 102 and between the drain electrode 105 and the n$^-$ region 102 by providing the silicide regions 106-1 and 106-2, respectively.

The A-mode MOSFET 100 shown in FIG. 1 has structural characteristics in that a p$^+$ buried region 110 is provided in the n$^-$ region 102 to be in contact with the n$^+$ region 103-1. Furthermore, the p$^+$ buried region 110 faces the insulating region 109-1 via part of the n$^-$ region 102.

The source electrode 104 and the drain electrode 105 are made of a metal generally used in the semiconductor field, such as tungsten (W), aluminum (Al), copper (Cu), or nickel (Ni), or poly-silicon (poly-Si).

For the silicide regions 106, a suitable constituent material is selected so that electrical contacts between the n$^+$ regions 103 and the source electrode 104 and drain electrode 105 are ohmic contacts.

The silicide region 106 is a diffusion region formed by thermal diffusion of the metal (to be referred to as "M" hereinafter) of a metal layer and silicon (Si) in the n$^+$ region by providing, using a sputtering method or the like, a metal layer of a predetermined thickness, which may also serve as part of a source or drain electrode, on the n$^+$ region which is provided on the BOX layer 101 and has a thickness enough to form a silicide region 106 of a predetermined thickness, and performing a heat treatment. For the metal layer, a low work function metal, for example, holmium (Ho), erbium (Er), samarium (Sm), or ytterbium (Yb) is preferably used. Especially, holmium (Ho) or erbium (Er) is desirable.

The constituent materials of the silicide regions 106-1 and 106-2 may be the same or different as long as appropriate ohmic contacts are formed.

The gate insulating layer 107 existing between the n$^-$ region 102 and the gate electrode 108 is made of a dense, electrically insulating material with high insulating performance, such as silicon oxide, silicon nitride, or silicon oxynitride.

The gate electrode 108 is generally made of poly-silicon (poly-Si) but can be made of a refractory metal such as tungsten (W) or tantalum (Ta), a metal such as titanium (Ti) or aluminum (Al), or a compound thereof.

The A-mode MOSFET shown in FIG. 1 is manufactured by a general semiconductor technique. The MOSFET 100 shown in FIG. 1 is formed on the BOX layer 101 with a thickness of, for example, about 50 nm provided on the surface of a supporting substrate (not shown) formed using a p-type silicon substrate. The n$^-$ semiconductor region 102 is formed on the BOX layer 101, and a channel region is formed within the n$^-$ semiconductor region 102. The n$^-$ semiconductor region 102 has a film thickness of, for example, 50 nm. The n$^-$ semiconductor region 102 includes, on its both sides, a source region (n$^+$ region 103-1) and a drain region (n$^+$ region 103-2) which are formed by an n$^+$ semiconductor which has the same conductivity type as that of the channel region and has an impurity atomic concentration higher than that of the channel region.

The gate insulating layer 107 formed by an oxide film with, for example, an equivalent oxide thickness (EOT) of 7.5 nm is provided on the n$^-$ semiconductor region 102. The gate electrode 108 made of p$^+$ poly-silicon is provided on the gate insulating layer 107. The gate length and gate width of the n-channel transistor shown in FIG. 1 are, for example, 0.6 µm and 20.0 µm, respectively.

Note that the average impurity atomic concentration of the n$^-$ semiconductor region 102 is, for example, about $2 \times 10^{17}$ cm$^{-3}$, and the average impurity atomic percentage of the n$^+$ regions 103-1 and 103-2 is, for example, about $2 \times 10^{20}$ cm$^{-3}$.

The source region 103-1, the drain region 103-2, and the silicide regions 106-1 and 106-2 are formed as follows. That is, low work function metal layers and anti-oxidant metal layers (tungsten (W) is typically adopted in the present invention) serving as a source electrode and drain electrode are stacked on the n$^+$ regions, and a heat treatment is performed to cause a silicidation reaction between the n$^+$ regions and the low work function metal layers.

As the material of the low work function metal layer, a metal material with a work function smaller than a value obtained by adding 0.3 eV to the absolute value of the conduction band bottom energy of n$^+$ silicon forming the source region 106-1 and drain region 106-2 is desirably selected. The metal material is especially preferably holmium (Ho) or erbium (Er).

In this case, to suppress mixing of impurities as much as possible, a sputtering method is desirably used as a metal layer forming method. For example, holmium (Ho) is deposited to have a thickness of 10 nm by performing sputtering in an Ar atmosphere. Sputtering may be performed in an Xe atmosphere, and erbium (Er) may be used instead of holmium (Ho), as described above. As mentioned above, holmium (Ho) or erbium (Er) is desirably used as a material having a temperature higher than 700° C. However, other rare earth metals such as samarium (Sm) and ytterbium (Yb) can be used.

When the source region 103-1 and the drain region 103-2 are made of n silicon, the low work function metal layer need only be formed by a metal material having a work function whose absolution value is smaller than a value obtained by adding 0.3 eV to the absolute value of the conduction band bottom energy of silicon.

Such material selection method can suppress the contact resistance with the n$^-$ semiconductor region 102 to $1 \times 10^{-9}$ Ωcm$^2$ or smaller, thereby setting the series resistance of the transistor which is the sum of the contact resistance and the series resistance at the source region 103-1 and drain region 103-2 as n$^+$ regions to 1.0 Ωµm.

The low work function metal layer is formed on the surface of the n$^+$ region, part of which forms the source region 103-1 and drain region 103-2 within a metal forming apparatus.

After forming the low work function metal layer, it is conveyed into the formation chamber of an anti-oxidant metal layer in an inert gas atmosphere such as nitrogen or argon whose pressure is reduced so as not to be exposed to air, thereby forming an anti-oxidant metal layer on the entire exposed surface of the n⁺ region for forming the source region 103-1 and the drain region 103-2. In this case, an anti-oxidant metal layer is formed by performing sputtering using tungsten (W) in an argon (Ar) atmosphere within a sputter chamber to have a thickness of 300 nm.

After that, the low work function metal layer and the anti-oxidant metal layer undergo a heat treatment (annealing) at, for example, 600° C., thereby forming a silicide layer region made of holmium (Ho) silicide or the like, as described above. Annealing is preferably performed in, for example, an Ar or N₂ atmosphere at 300 to 700° C. for 2 to 60 min. More preferably, for holmium (Ho) or erbium (Er), it is desirable to perform annealing at 600° C. for about 10 min. By performing annealing as described above, the whole of the holmium (Ho) or erbium (Er) layer is silicidized, thereby minimizing a barrier height. When 700° C. is exceeded, a chemical reaction between tungsten (W) and holmium (Ho) or erbium (Er) occurs. As a result, the barrier height rapidly increases. Therefore, annealing at a temperature higher than 700° C. is not preferable.

In this case, it is possible to reduce the surface roughness of the silicide layer by setting the thickness of the anti-oxidant metal layer to be larger than that of the low work function metal layer, thereby preventing the destruction of a p-n junction. If, for example, a W layer does not exist, holmium (Ho) or erbium (Er) forming the low work function metal layer unwantedly oxidizes in annealing, and thus it is impossible to form a high-quality silicide thin film of a metal having a desired low work function. To the contrary, if a W layer is provided, oxidization of holmium (Ho) or erbium (Er) is suppressed, a defect does not occur or substantially no defect occurs in a formed silicide thin film, and thus it is possible to form a high-quality silicide thin film of a metal having a desired low work function. That is, as a result, a high-quality silicide thin film having a low work function is formed.

The thickness of the anti-oxidant metal layer which prevents interference with formation of a flat interface between the n⁺ silicon layer region and the silicide region formed when the constituent metal of the low work function metal layer migrates in annealing is selected according to the thickness of the low work function metal layer, as needed. If, for example, the anti-oxidant metal layer is a W layer, its thickness is desirably 100 nm or larger. In this case, a significant effect can be obtained.

The thickness (t) of a portion which is part of the n⁻ semiconductor region 102 and is sandwiched between the insulating region 109-1 and the p⁺ buried region 110, that is, the distance (L) between the bottom surface of the insulating region 109-1 and the upper surface of the p⁺ buried region 110 is set to be almost equal to the thickness of the channel region formed in the n⁻ semiconductor region 102. In the present invention, the thickness (t) (distance (L)) is preferably set to be almost equal to the thickness of an accumulation layer formed under the gate insulating layer 107, and is more preferably set to about several nm to 10 nm. If the thickness is set to be smaller than several nm, electrons cannot be emitted by thermionic emission from the n⁺ region 103-1 or silicide region 106-1 when setting to an ON state, thereby making an ON current small. If the thickness is set to about 10 nm or larger, a so-called tunnel effect cannot be expected.

A case in which the present invention is applied to an A-mode n-channel MOSFET has been described. However, the present invention is also equally applicable to an A-mode p-channel MOSFET. Furthermore, although an Si semiconductor has been exemplified as a semiconductor, it is possible to adopt another semiconductor such as a Ge, SiGe, or SiC semiconductor in the present invention.

Main steps of a typical example of the manufacturing conditions of the semiconductor apparatus shown in FIG. 1 will be described. A manufacturing method is performed according to a procedure and conditions which are generally adopted in a semiconductor manufacturing method.

[Step 1]: Formation of an n⁻ well (3e17 cm⁻³) in an SOI substrate

[Step 2]: Isolation: etching of a silicon portion except for an active region (plasma etching using (Ar/HBr) gas)

[Step 3]: Gate oxidization (1.5 nm, 400° C., radical oxidization). A high-k film may be deposited.

[Step 4]: Poly-Si deposition (a thickness of 150 nm, 530° C., SiH₄)

[Step 5]: Boron ion (B⁺) implantation (5e15 cm⁻², 10 keV)

[Step 6]: Gate poly-Si etching (Ar/HBr)

[Step 7]: BF₂ implantation (1E15 cm⁻² (tilt)) 7°))

[Step 8]: Sidewall formation: Si₃N₄ (SiH₄, N₂, H₂ plasma CVD)+dry etching (C₅F₈)

[Step 9]: As implantation (3e15 cm⁻², 25 keV (tilt 0°))

[Step 10]: Er sputtering deposition (W/Er=100/5 nm)+annealing, 500° C., 2 min

[Step 11]: Patterning+W wet etching (alkali etching)+Er wet etching (room temperature, H₂SO₄+H₂O₂)

[Step 12]: Activation annealing, N₂, 1000° C., 5 sec

[Step 13]: Reoxidation (radical oxidization 7 nm)

[Step 14]: CVD-SiO₂, 300 nm

[Step 15]: Contact hole formation, dry etching (C₅F₈)

[Step 16]: Al deposition, 500 nm

[Step 17]: Al etching

In the present invention, a commercial SOI substrate may be obtained and used without forming a BOX layer on an Si substrate as long as the object is achieved, as a matter of course.

Figure 2:
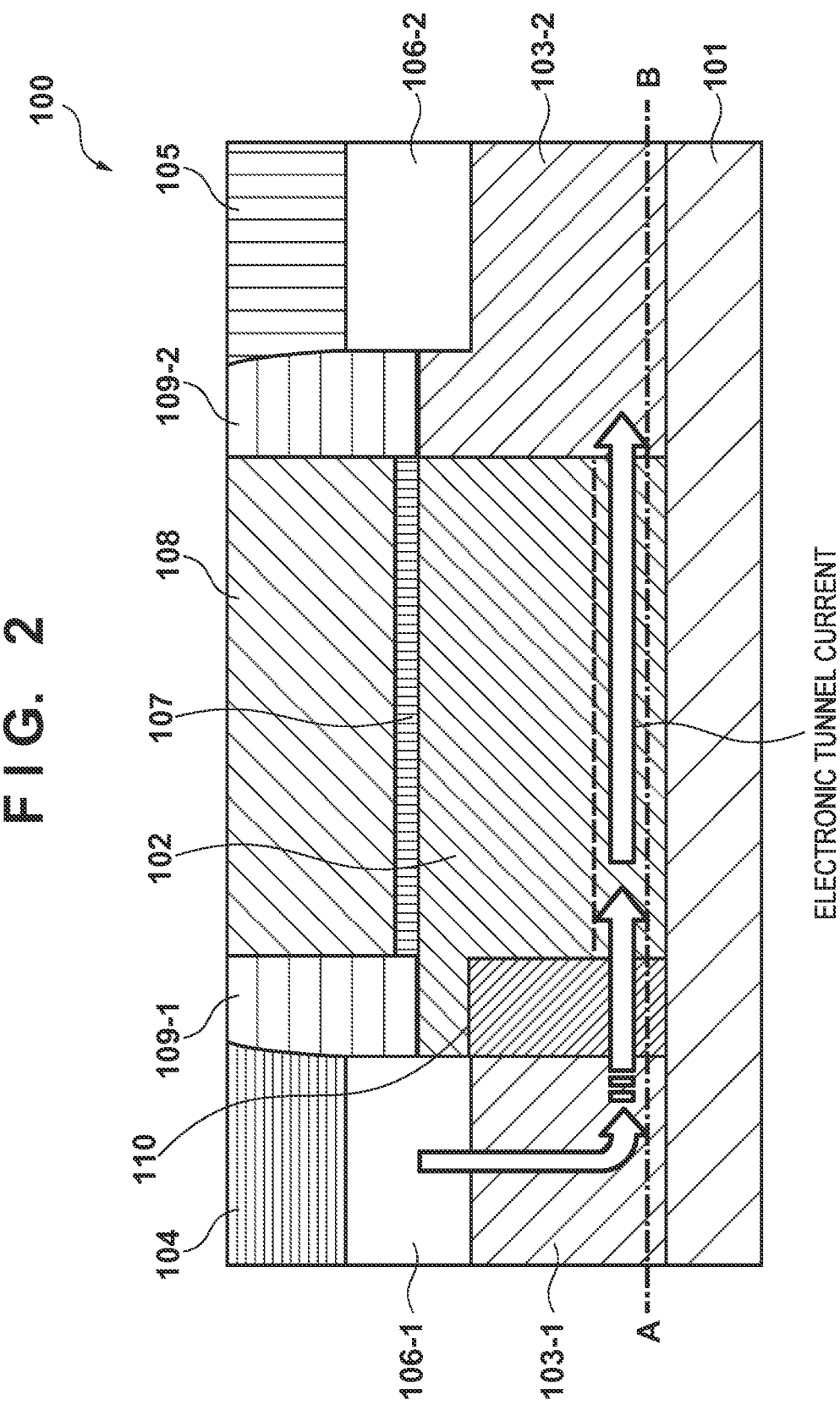
FIG. 2 is a schematic view for explaining a current path in the neighborhood of a threshold voltage (upon switching)
Figure 3:
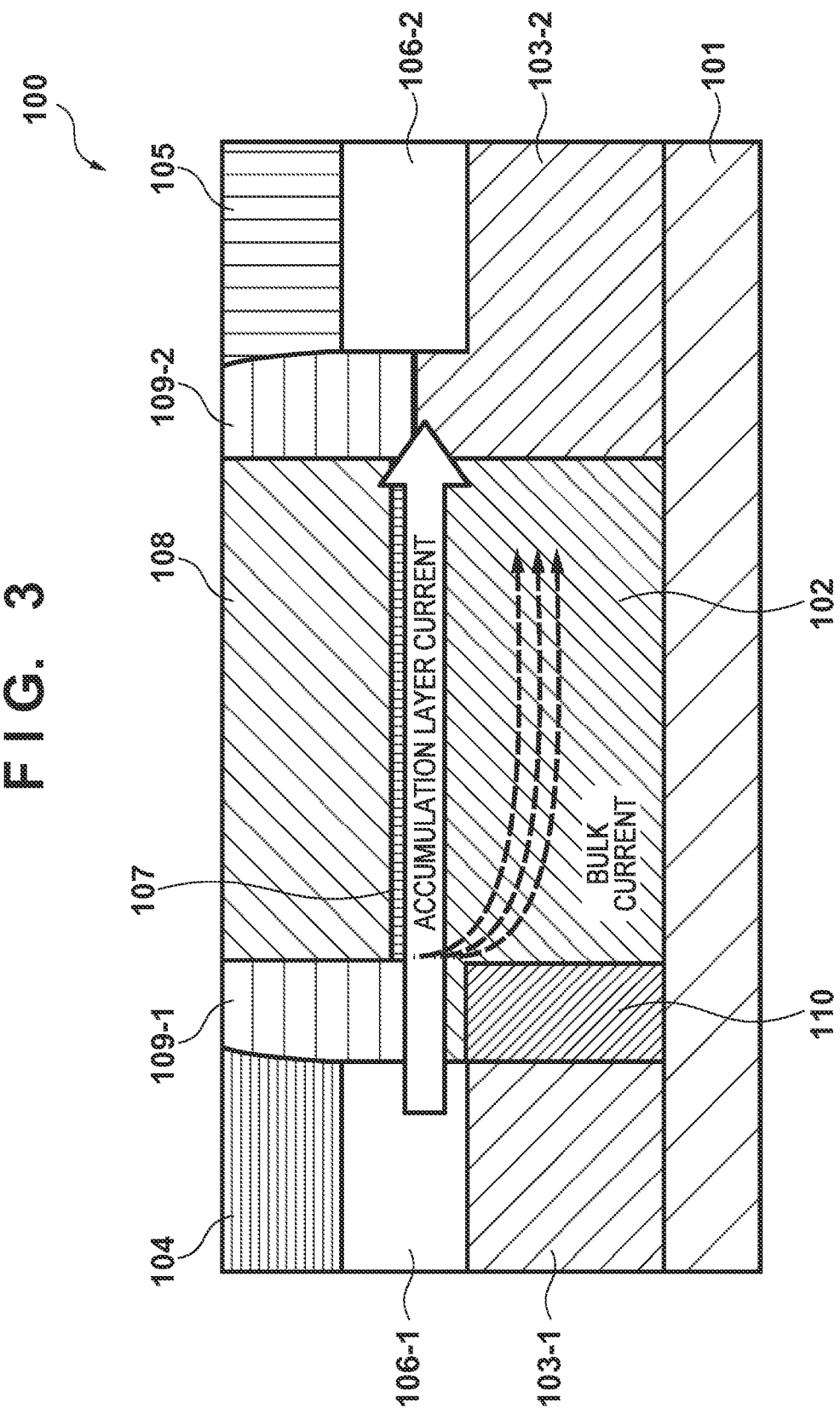
FIG. 3 is a schematic view for explaining a current path in an ON state (operation state).

A typical example of a method of operating the semiconductor apparatus according to the present invention will be described with reference to FIGS. 2 and 3. FIG. 2 is a schematic view for explaining a current path in the neighborhood of a threshold voltage (upon switching). FIG. 3 is a schematic view for explaining a current path in an ON state (operation state). The same reference numerals as those in FIG. 1 denote the same components.

When a power supply voltage is applied to the gate electrode 108, the potential of the gate electrode 108 changes as electric charges are accumulated in the gate electrode 108, and reaches the power supply voltage. This process until the potential of the gate electrode 108 reaches the power supply voltage may be referred to as a transient process hereinafter.

When the voltage applied to the gate electrode 108 of the MOSFET 100 is close to the threshold (a voltage immediately before reaching the power supply voltage), a depletion layer formed in the n⁻ semiconductor region 102 extends to the lower portion of the n⁻ semiconductor region 102, and thus the channel region is formed in the lower portion of the n⁻ semiconductor region 102. That is, when the upper surface of the p⁺ buried region 110 is formed to be sufficiently higher than the formed channel region, a source-drain current is an electronic tunnel current flowing by tunneling the p⁺ buried region 110 (a current path is indicated by arrows in FIG. 2) in the neighborhood of the threshold voltage. The electronic tunnel current is a bulk current which starts to flow when the potential of the gate electrode 108, that is, the gate voltage is still small.

A current path at application voltage (power supply voltage) ("ON voltage" or "operation voltage") for setting an ON state is indicated by an arrow in FIG. 3. When the gate voltage reaches the power supply voltage, a current (accumulation region current) based on electric charges accumulated in the accumulation region so far starts to flow. The bulk current which started to flow in the transient process continues to flow even after the gate voltage reaches the power supply voltage.

In the preferred MOSFET of the present invention, when changing from an OFF state to an ON state, a current tunnels through the $p^+$ buried region via a path "$n^+$ region 103-1→$p^+$ buried region 110→$n^-$ region 102" to inject carriers from the $n^+$ region 103-1 into the $n^-$ region 102, thereby forming a so-called tunnel current. Therefore, a limitation of 60 mV/dec at room temperature is eliminated. If a potential barrier formed in the $p^+$ buried region 110 is appropriately controlled by the width of the $p^+$ buried region 110, it is possible to change from the OFF state to the ON state at a gradient of 60 mV/dec or smaller.

The present invention is not limited to the above-described embodiments, and various changes and modifications can be made within the spirit and scope of the present invention. Therefore, to apprise the public of the scope of the present invention, the following claims are made.

REFERENCE SIGNS LIST

100 ... MOSFET
101 ... box layer
102 ... $n^-$ region
103 ... $n^+$ region
104 ... source electrode
105 ... drain electrode
106 ... silicide region
107 ... insulating layer
108 ... gate electrode
109 ... insulating region
110 ... $p^+$ buried region

What is claimed is:

1. An accumulation-mode MOSFET comprising:
a semiconductor region where a channel region is formed;
a gate electrode and a gate insulating film for forming the channel region;
a source region portion for injecting carriers; and
a drain region for ejecting carriers, wherein
a tunnel electron emission portion which emits an electronic tunnel current flowing the channel region through tunneling and a thermionic emission portion which emits an accumulation region current flowing the channel region through thermionic emission are provided in the source region portion.

2. The accumulation-mode MOSFET according to claim 1, wherein said tunnel electron emission portion and said thermionic emission portion form a two-layered structure.

3. A method of driving an accumulation-mode MOSFET comprising
a semiconductor region where a channel region is formed;
a gate electrode and a gate insulating film for forming the channel region;
a source region portion for injecting carriers; and
a drain region portion for ejecting carriers, the method comprising:
driving the accumulation-mode MOSFET by an electronic tunnel current emitted by a tunnel electron emission portion when transiting from an OFF state to an ON state until a gate voltage applied to the gate electrode reaches a power supply voltage, and driving the accumulation-mode MOSFET by an accumulation region current emitted by a thermionic emission portion in the ON state where the gate voltage applied to the gate electrode is the power supply voltage, wherein
the tunnel electron emission portion which emits the electronic tunnel current flowing the channel region through tunneling and the thermionic emission portion which emits the accumulation region current flowing the channel region through thermionic emission are provided in the source region portion of the accumulation-mode MOSFET.

4. The method of driving the accumulation-mode MOSFET according to claim 3, wherein there exists a region where a gate voltage necessary for increasing a drain current by an order of magnitude when transiting from the OFF state to the ON state is smaller than 60 mV at least at room temperature.

* * * * *